(12) United States Patent
Ingle et al.

(10) Patent No.: US 9,203,029 B2
(45) Date of Patent: Dec. 1, 2015

(54) METHOD FOR PRODUCING AN ELECTRONIC COMPONENT

(75) Inventors: Andrew Ingle, Allershausen (DE); Tilman Schlenker, Nittendorf (DE); Karsten Heuser, Erlangen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 807 days.

(21) Appl. No.: 13/498,307

(22) PCT Filed: Sep. 16, 2010

(86) PCT No.: PCT/EP2010/063623
§ 371 (c)(1),
(2), (4) Date: Jun. 5, 2012

(87) PCT Pub. No.: WO2011/036089
PCT Pub. Date: Mar. 31, 2011

(65) Prior Publication Data
US 2012/0267147 A1    Oct. 25, 2012

(30) Foreign Application Priority Data

Sep. 25, 2009  (DE) .......................... 10 2009 043 066
Dec. 22, 2009  (DE) .......................... 10 2009 060 066

(51) Int. Cl.
| H05K 3/02 | (2006.01) |
| H01L 51/00 | (2006.01) |
| H01L 51/52 | (2006.01) |
| H01L 27/32 | (2006.01) |

(52) U.S. Cl.
CPC ........ *H01L 51/0023* (2013.01); *H01L 51/5203* (2013.01); *H01L 27/3288* (2013.01); *Y10T 29/49155* (2015.01)

(58) Field of Classification Search
CPC .... H01L 24/03; H05K 3/4644; H05K 3/4602; Y10T 29/49126
USPC ........ 29/847, 825, 829, 846, 848; 257/59, 72, 257/79, 98, E27.111, E27.291
See application file for complete search history.

(56) References Cited

U.S. PATENT DOCUMENTS

| 7,001,796 B2* | 2/2006 | Cho et al. ..................... 438/104 |
| 7,202,502 B2* | 4/2007 | Park et al. ..................... 257/72 |
| 2007/0249111 A1 | 10/2007 | Lin |
| 2009/0189151 A1 | 7/2009 | Börner et al. |
| 2010/0084646 A1 | 4/2010 | Matsusue et al. |

FOREIGN PATENT DOCUMENTS

| DE | 19715048 | 10/1998 |
| JP | 2009-156913 | 7/2009 |
| WO | WO93/00695 | 1/1993 |
| WO | WO98/47183 | 10/1998 |
| WO | WO2009/110186 | 9/2009 |

* cited by examiner

*Primary Examiner* — Thiem Phan
(74) *Attorney, Agent, or Firm* — Cozen O'Connor (57) ABSTRACT

A method for producing an electronic component with at least one first electrode zone (21) and one second electrode zone (23), which are separated from one another by an insulator (9) and each comprise at least one sublayer of a first electrically conductive material. Also disclosed is an electronic component, which may be produced using the disclosed method.

4 Claims, 6 Drawing Sheets

METHOD FOR PRODUCING AN ELECTRONIC COMPONENT

RELATED APPLICATIONS

This is a U.S. national stage of application No. PCT/EP2010/063623, filed on Sep. 16, 2010. Priority is claimed on the following applications: German Application No.: 10 2009 043 066.0 filed on Sep. 25, 2009 and German Application No.: 10 2009 060 066.3 filed on Dec. 22, 2009, the disclosure contents of both of which are hereby incorporated by reference.

FIELD OF THE INVENTION

The present invention relates to a method for producing an electronic component and to an electronic component.

BACKGROUND OF THE INVENTION

In electronic components such as organic light-emitting diodes insulators serve inter alia to separate two electrode zones from one another. Suitable insulators such as for example photosensitive lacquers are generally very expensive and difficult to apply.

SUMMARY OF THE INVENTION

An object of the present invention is to provide a method improved over the prior art for producing an electronic component, in which the insulator is applied only to specific zones of an electrically conductive layer.

A method according to one embodiment of the invention is suitable for producing an electronic component with at least one first electrode zone and one second electrode zone, which are separated from one another by an insulator and each comprise at least one sublayer of a first electrically conductive material.

The method according to one embodiment of the invention comprises the following steps:

A) providing a substrate layer and at least one first electrically conductive layer of the first electrically conductive material arranged on the substrate layer;

B) arranging at least one second electrically conductive layer of a second electrically conductive material on the first electrically conductive layer;

C) arranging at least one first insulator on the substrate, such that the second electrically conductive layer comprises at least one first subzone, which is covered with the insulator, and a second subzone, which is not covered with the insulator, the insulator being arranged such that it may serve to separate the first electrode zone and the second electrode zone from one another; and D) arranging at least one functional layer and at least one second electrode layer on the second electrically conductive layer obtained in the preceding step, which is covered in places with the insulator.

The term "electrode zone", as used herein, denotes a zone or portion, functioning as an electrode, of the electronic component or of an electrode layer thereof. The electrode layer may be an anode layer or a cathode layer.

The first and second electrode zones each comprise at least one sublayer of a first electrically conductive material. The term "electrically conductive material", as used herein, denotes a material or a substance with the ability to conduct electrical current. The term "sublayer of a first electrically conductive material", as used herein, means that the electrode zones each comprise or consist of a portion formed as a layer of the first electrically conductive material. The sublayer formed of the first electrically conductive material is in this case clearly separated from possible further layers, such that for example the formation of an alloy between the first electrically conductive material and each further material applied in the respective electrode zone is ruled out.

The term "insulator", as used herein, denotes an insulating substance which is applied such that it prevents current flow between the first electrode zone and the second electrode zone. The insulator may be a coating or a coating composition, such as a polymer or the like, and in particular a lacquer and the like.

The term "lacquer" should here be taken to mean a coating material applicable in liquid or indeed in powder form.

The phrase "first electrically conductive layer", as used herein, denotes a layer comprising the first electrically conductive material or a layer consisting of the first electrically conductive material, which is deposited directly on the substrate layer. The first electrically conductive layer may be a transparent conductive layer. Without being limited thereto, it may be formed of a transparent conductive oxide (TCO), for example indium-doped tin oxide (ITO) or ZnO, In/ZnO, SnZnO, Al—ZnO and the like. The first electrically conductive layer may be applied to the substrate layer for example by means of sputtering.

A second electrically conductive layer of a "second electrically conductive material" is deposited on the first electrically conductive layer, which material is conventionally different from the first electrically conductive material. For example, the first electrically conductive material may be provided in particular for the anode of the finished device, the second electrically conductive material being provided for the cathode or vice versa. Examples of the second electrically conductive material include, without being limited thereto, metals, for example aluminium, barium, indium, copper, silver, gold, magnesium, calcium and lithium and the like and mixtures or combinations thereof, in particular in the form of alloys with one another or with other metals. The second electrically conductive layer may comprise just one or indeed a plurality of sublayers. The individual sublayers may then mutually independently each consist of or contain the above-stated materials; in addition to the metals listed explicitly above, they may also contain or consist of the metals chromium and molybdenum. Examples of layer sequences in a second electrically conductive layer comprising a plurality of sublayers are Mo/Al/Mo, Cr/Al/Cr, Cu/Cr and Cr/Cu.

The second electrically conductive layer may be applied by means of sputtering, physical vapour deposition (PVD) or the like to the first electrically conductive layer.

The term "substrate layer", as used herein, denotes a layer of a substrate as is conventionally used for example in the prior art for an electronic component. The substrate may be a transparent or a non-transparent substrate. For example, the substrate may comprise glass, quartz, sapphire, plastics films, coated plastics films, metal, metal foils, films coated with an electrically insulating layer, silicon wafers or any other suitable substrate material. According to the invention, the substrate layer is in particular taken to mean the layer on which all the other layers are subsequently applied during production of the electronic component. In the case for example of an optical electronic component, for example a radiation-emitting device, such subsequent layers may be layers required for radiation emission.

The "second electrode layer" may comprise a material or be formed of a material which is selected from metals such as aluminium, barium, indium, silver, gold, magnesium, calcium and lithium and combinations thereof or a compound thereof, in particular an alloy, as well as transparent conductive oxides, such as for example metal oxides, such as zinc oxide, tin oxide, cadmium oxide, titanium oxide, indium oxide or indium-doped tin oxide (ITO), aluminium-doped zinc oxide (AZO), $Zn_2SnO_4$, $CdSnO_3$, $MgIn_2O_4$, $GaInO_3$, $Zn_2In_2O_5$ or $In_4Sn_3O_{12}$ or mixtures of different transparent conductive oxides. The second electrode layer is preferably formed of a metal. The second electrode layer of the electronic component may be a cathode layer.

A "functional layer" of the electronic component performs a function which is characteristic of the electronic component. For example, functional layers may be radiation-emitting layers, such as fluorescent and/or phosphorescent emitter layers of an organic light-emitting diode.

An "electronic component", which may be produced using the method according to the invention, may, without being limited thereto, be a transistor, a capacitor, a thermistor, an organic electronic component, such as an organic light-emitting diode, a solar cell, and the like.

It is possible, with the method according to one embodiment of the invention, to separate two electrode zones from one another, wherein structuring of the electrode zones takes place at a preselected position during application of the electrode zones or subsequently and the insulator applied to the second electrically conductive layer is arranged in the zone formed by the structuring. The structuring is conventionally introduced later.

If the structuring is already present (i.e. introduced "earlier"), this may take place by applying the first and second electrically conductive layers or subzones thereof to the substrate for example by printing, by deposition using SAMs (self assembling monolayers) and the like.

The insulator is applied (conventionally exclusively) to the second electrically conductive layer. Provision is made according to the invention for the insulator to be applied to the second electrically conductive layer only in predetermined zones or portions.

Arranging the insulator only in the first subzone of the second electrically conductive layer may be performed, depending on the composition of the insulator, by means of a printing process, with the assistance of a syringe, nozzle, grommet and the like. After completion of the electronic component, the first subzone may serve as a bond pad or as a bus bar for subsequent contacting of the electronic component.

The second electrically conductive layer is subdivided by means of the insulator applied to the substrate into at least two subzones, of which one is covered with insulator and the other is not covered. At the same time, the insulator is arranged such that it may serve to separate the first and the second electrode zones of the first electrically conductive layer from one another. This should in particular also be taken to mean that in a later method step the insulator is made deformable, which makes it possible to arrange the insulator in such a way that the electrode zones are separated from one another by the insulator.

The method according to one embodiment of the invention of producing an electronic component may be used to produce electronic components more economically with regard to cost and time. Since each layer of the component is applied individually and may optionally, as desired or required, be structured (as may be inferred from the following further developments of the method), complex coating or application steps may thus be avoided and (often expensive) material may additionally be saved.

By applying the second electrically conductive layer according to the invention extensively on the first electrically conductive layer, it is additionally possible to prevent the first electrically conductive layer, such as for example a sensitive ITO layer, from coming into contact with the insulator to be printed on and/or the protective material and possibly being damaged or impaired. In addition, the first electrically conductive layer does not come into direct contact with the installations. The first electrically conductive layer may additionally in particular be free of particles, such as contaminants, since etching of the second electrically conductive layer removes contaminants, such as residues, which may arise through redeposition of an optionally performed laser ablation process.

The method according to one embodiment of the invention makes it possible to achieve "self aligning" of the second electrically conductive material and of the insulator. In this way it is for example possible to provide conductor tracks or bond pads, simply and easily in the electronic component produced according to the invention.

In a further development of the method according to the invention, the method comprises the following step:

E) removing first electrically conductive material of the first electrically conductive layer at least along a predetermined separation zone between the first electrode zone and the second electrode zone. This removal step can be performed after step A) and before step B).

The predetermined separation zone may be a sort of trench or gap between the first and second and any further electrode zone of the first electrically conductive layer formed by removing the first electrically conductive material.

It is alternatively possible to remove both the first electrically conductive material of the first electrically conductive layer and the second electrically conductive material of the second electrically conductive layer, located over the first electrically conductive material, at least along a predetermined separation zone between the first electrode zone and the second electrode zone (step F)).

This step is normally performed after step B) and before step C).

Removal of both the first and second electrically conductive material may in this case proceed preferably simultaneously, i.e. in one step.

In a further development of the method according to the invention, the method according to the two above alternatives comprises removal of the first electrically conductive material (step E) or removal of the first electrically conductive material and of the second electrically conductive material (step F)) by means of laser ablation.

The term "laser ablation", as used herein, covers the removal of the first electrically conductive material or the removal of the first and of the second electrically conductive materials from the surface of the substrate layer by bombardment with pulsed laser radiation.

During removal or erosion of the second electrically conductive layer and the first electrically conductive layer by means of laser ablation, in particular only the uppermost, i.e. the second electrically conductive layer heats up. This may be particularly advantageous when it comes to protecting the first electrically conductive layer, for example an ITO layer, which is generally a very sensitive layer.

In a further development of the method according to the invention, the method additionally comprises the step G) of arranging at least one protective material in at least one third subzone of the second electrically conductive layer, which is arranged in the second subzone.

The term "protective material", as used herein, denotes a material or a substance which serves to protect the second electrically conductive material of the second electrically conductive layer in the subzones in which it has been applied to the second electrically conductive layer, in particular in the further procedure of producing the electronic component, i.e. in further process steps.

The protective material may be a coating material such as a lacquer and the like. In particular, the protective material may be an alkali-soluble etching resist, for example an etching resist as used in the production of printed circuit boards (PCBs). This etching resist may be crosslinked or cured thermally or by means of UV radiation. The protective material is preferably soluble in a solvent in which the insulator is insoluble. Mention may be made in this regard for instance of alkaline solutions for example weak alkaline aqueous solutions of salts inter alia (for example NaOH, KOH, $NH_4OH$, or quaternary ammonium salts as $N(CH_3)_4OH$).

Arrangement of the protective material may take place both after application of the second electrically conductive layer to the first electrically conductive layer and before application of the insulator to the second electrically conductive layer and after application of the insulator to the second electrically conductive layer and before application of a functional layer to the second electrically conductive layer.

Application of the protective material proceeds in such a way that the second electrically conductive layer is covered with protective material in the third subzone and in at least one fourth subzone, which is arranged in the second subzone, is not covered with the protective material nor with the insulator.

The protective material may be arranged, at least in places, over or on the insulator.

In a further development of the method according to the invention, the protective material is arranged at a distance from the insulator on the second subzone, such that a gap remains between the first subzone and the third subzone. In this embodiment the protective material is not arranged on the insulator.

The "distance" at which the protective material is arranged on the insulator may be a predetermined distance. The "gap" which is produced by arranging the protective material spaced from the insulator may be a zone which corresponds to the separation zone or the separating line between the first and second electrode zones.

According to this further development of the method according to the invention, at least some of the first electrically conductive material of the first electrically conductive layer and of the second electrically conductive material of the second electrically conductive layer, located in the zone of the gap, as described above, is removed. The first electrically conductive material to be removed of the first electrically conductive layer and the second electrically conductive material of the second electrically conductive layer are normally located under the gap.

In a further development of the method according to the invention for producing the electronic component, the method comprises the following step:

H) at least partial removal of the second electrically conductive layer in at least the fourth subzone.

This step H) may proceed both after step C) and before step D) as well as after step G) and before step D).

The second electrically conductive material is in this case removed substantially in the fourth subzone of the second subzone, i.e. in that zone which is covered neither by protective material nor by insulator. By removing second electrically conductive material, the first electrically conductive layer located under the second electrically conductive layer is exposed in the zone of the fourth subzone of the second electrically conductive layer (and not removed). Removal thus proceeds by means of a method which selectively removes just one layer, for example a metal layer.

In a further development of the method according to the invention for producing the electronic component, the second electrically conductive layer is removed by etching. Etching of the second electrically conductive material may in this case proceed using an etching bath.

The term "etching", as used herein, denotes removal of the second electrically conductive material on the surface of the first electrically conductive layer by applying suitable etching substances; these may be chemical substances which modify (generally oxidise) the material to be removed in a chemical reaction and thus generally dissolve it. Etchants are normally acids or strong oxidising agents. Examples worthy of mention are $HNO_3$, HCl, $H_3PO_4$, acetic acid, $H_2SO_4$, cerium ammonium nitrate (CAN) and $H_2O_2$.

In such an embodiment both the insulator and the protective material are resistant to the chemicals, such as for example acids, used for etching the second electrically conductive material. In the zones of the second electrically conductive layer on which they are applied, the insulator and the protective material provide an etch stop function for the second electrically conductive layer or the second electrically conductive material in the corresponding zones of the second electrically conductive layer. In addition, the etching bath is selected such that the first electrically conductive layer, for example a sensitive ITO layer, is not attacked or impaired by the etchant used.

By etching the second electrically conductive material, the structures of the first electrically conductive layer and the second electrically conductive layer located under the insulator and/or under the protective material layer are maintained.

An advantage of the method according to one embodiment of the invention may consist in just one individual etch step being required to remove the second electrically conductive material in the fourth subzone arranged in the second subzone of the second electrically conductive layer and thus to expose parts of the first electrically conductive layer as the first and second electrode zones.

In a further development of the method according to the invention, the method comprises the following step:

I) removing the protective material from the second electrically conductive layer.

Removal of the protective material from the second electrically conductive layer in this case takes place after step H).

Since the insulator is only applied at specific, previously determined points on the second electrically conductive layer, in the method according to the invention an electrically non-conductive material, the protective material, has optionally to be removed just once. The protective material used may generally be removed with the assistance of a suitable solvent, instead, as may be conventional in the prior art, of by means of etching.

The protective material may for example also be removed by means of stripping. The term "stripping" in this case denotes ashing or removal of protective material, such as for example of a (photo)resist. As a rule, an oxygen plasma is in this case used in the "stripper" or asher, to burn off the (photo)resist.

By removing the protective material from the second electrically conductive layer, second electrically conductive material is completely exposed. The exposed zones of the second electrically conductive layer may be used as the second electrode of the electronic component. They may form part of the second electrode or serve wholly as the second electrode.

In a further development of the method according to the invention, the insulator is applied directly on the second electrically conductive layer and arranged on the second electrically conductive layer such that it is located in the immediate vicinity of the separation zone between the first electrode zone and the second electrode zone. The term "in the immediate vicinity" means that the insulator is applied spatially to the second electrically conductive layer in such a way that it is capable, as the result of subsequent treatment such as for example softening, of flowing into the separation zone between the first electrode zone and the second electrode zone. For example, the insulator may be arranged in such a way that its distance from the separation zone is no greater than the width of the separation zone.

The insulator may be applied to the second electrically conductive layer in a predetermined pattern. Such a pattern may, for example, be predetermined by means of coordinates or the like before application of the insulator. The insulator may be applied to the second electrically conductive layer by means of a mask or a stencil or defined coordinates, which are applied to the surface of the second electrically conductive layer as a reference system.

By applying the insulator and the protective material at specific points by means of a printing process, it is additionally possible to reduce or rule out the risk of errors caused by incorrect orientation of the photolithographic installation during application of the photosensitive lacquers.

In a further development of the method according to the invention, the insulator is in this case applied to the second electrically conductive layer by means of a printing method. Suitable printing process include planographic, relief, intaglio and screen printing processes and combinations thereof. The insulator may in particular be printed onto the second electrically conductive layer by screen printing, ink-jet printing, flexographic printing and the like. Further suitable printing process include pad printing, stamp printing process, pochoir and the like.

The protective material may, like the insulator, also be printed on the second electrically conductive layer. The above-stated explanations relating to suitable printing process therefore likewise apply to printing of the protective material.

With the method according to one embodiment of the invention it is advantageously possible, by printing on the insulator and the protective material, to make savings both on material and time and thus on costs over the methods conventionally used in the prior art, such as for example lithographic methods.

In contrast to the lithographic methods used conventionally, in which each coating step is individually applied and structured photolithographically, in the method according to the invention only that quantity of material of the insulator and of the protective material, which may as a rule both be expensive materials, is applied which is needed to produce the electronic component. In this way OLED tiles, which are complex and expensive to produce by conventional methods, may advantageously be produced in a time- and material-saving manner.

Since simple lacquers may be used in the method according to one embodiment of the invention as the insulator and/or protective material, it is additionally advantageously possible to dispense with the use of expensive chemicals, such as for example photosensitive lacquers, which are generally used in photolithographic methods. Since according to the invention no subsequent structuring of the individual layers is necessary, it is additionally advantageously possible to dispense with expensive installations.

In a further development of the method according to the invention, the method includes the step J) of establishing conditions in which the insulator may be brought at least partially into a flowable state and the step K) of introducing the insulator or allowing it to flow into at least one portion of the separation zone between the first electrode zone and the second electrode zone.

The insulator is in this case in particular a liquefiable insulator, such as for example a polymer or a lacquer. To be able to liquefy the insulator, one or more of the following conditions, temperature increase, pressure, light, reagents, vapour and the like, may be established as conditions for liquefaction of the insulator. If the material is selected suitably, the insulator may soften as a result of heating of the substrate layer or direct exposure of the second electrically conductive layer to radiant heat. The insulator may then flow over the edges of the second electrically conductive layer and/or the first electrically conductive layer. In addition, the insulator may be softened by being introduced into a solvent atmosphere, for example water, or indeed a lower-boiling solvent. In this way the structure of the insulator may advantageously be rounded.

In a further development, the method is such that at least one conductor track of the second electrically conductive material is arranged on the first electrically conductive layer in the first electrode zone.

In the finished electronic component it is clearly discernible both with the naked eye and under a microscope that the insulator has been printed on. At the edges undulating or fissured structures are in each case visible, which do not occur when a photolithographic method is used (clear straight line).

The method according to one embodiment of the invention does not conventionally include any photolithographic steps and an economic method may therefore be used to produce an electronic component, such as for example an organic light-emitting diode. It is possible, by means of the method according to the invention, to produce an electronic component of robust design. The method according to the invention may therefore also be used to mass-produce electronic components.

All in all, the method according to the invention may thus provide a highly cost-effective method, for example for producing OLED tiles.

BRIEF DESCRIPTION OF THE DRAWINGS

Embodiments of the present invention are hereinafter illustrated with reference to the figures without restricting its general nature. Similar or identical elements are labelled with the same reference signs in the figures, in which:

FIGS. 1 A-I illustrate a method of producing an electronic component according to a first embodiment of the present invention;

FIGS. 2 A-I illustrate a method of producing an electronic component according to a second embodiment of the present invention.

DETAILED DESCRIPTION OF THE DRAWINGS

FIGS. 1A to I show preparation of a substrate for the production of an electronic component using the method of the invention according to a first embodiment.

A substrate layer 1 (see FIG. 1A) may for example be formed of glass. Alternatively, the substrate layer 1 may also be formed of plastics films, coated plastics films, metal foils, which are for example coated with an electrically insulating layer, and the like.

Figure 1A:
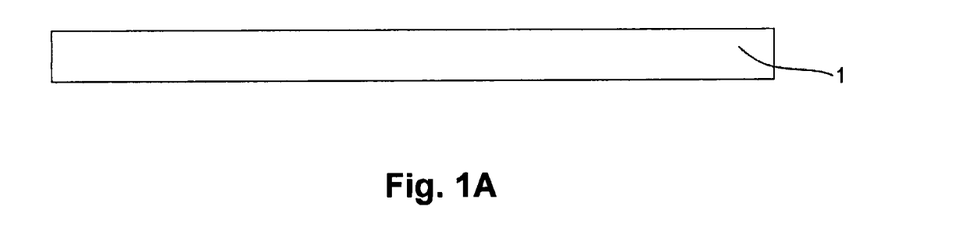
Figure 1B:
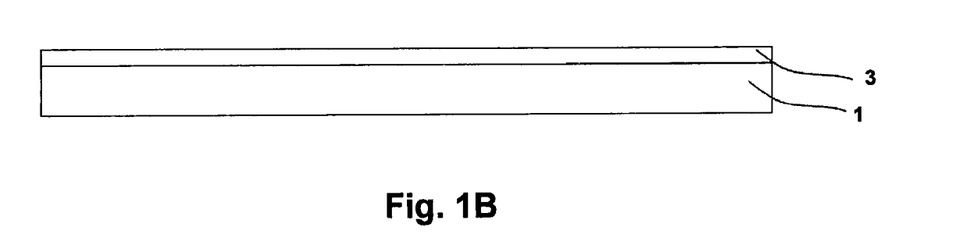

Processing begins with extensive coating of the substrate layer 1 with a first electrically conductive layer 3 (see FIG. 1B).

The first electrically conductive layer 3 may for example be a transparent layer of ITO. Alternatively, the first electrically conductive layer 3 may also be formed of another transparent electrical material, such as for example ZnO, In/ZnO, SnZnO, Al—ZnO or another suitable material, which is designed to withstand the process of etching the second electrically conductive material.

Coating may for example proceed by means of sputtering.

Figure 1C:
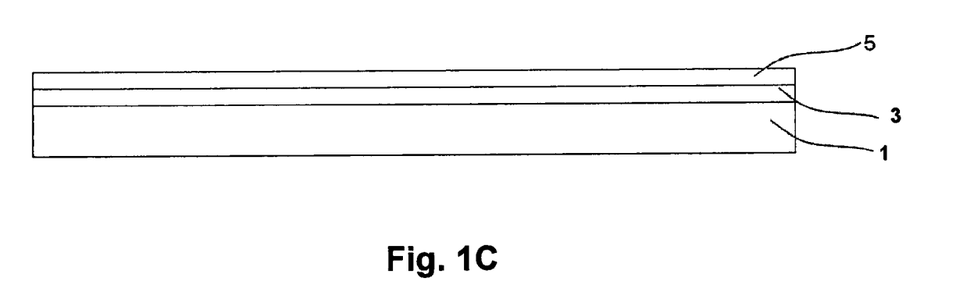

In the next step the first electrically conductive layer 3 is coated extensively with a second electrically conductive layer 5 (see FIG. 1C). In this case, a metal may be used as the second electrically conductive material for the second electrically conductive layer 5. However many other metals and combinations thereof are possible. The second electrically conductive layer 5 may be, deposited by means of sputtering, PVD and the like.

Figure 1D:
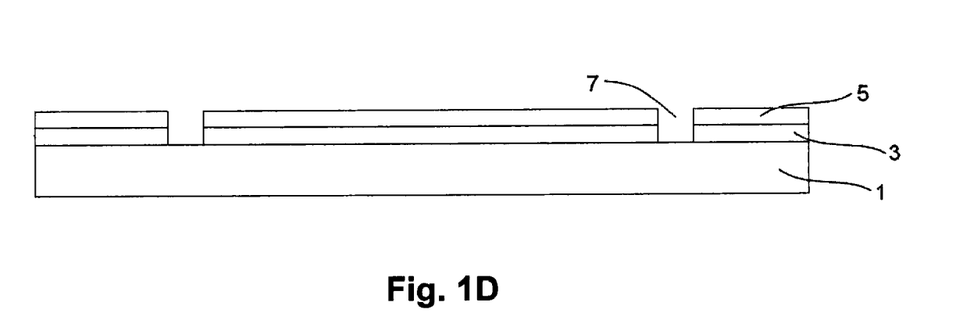

As shown in FIG. 1D, laser ablation then takes place, which produces a separation zone 7 or a trench in the second electrically conductive layer 5 and the first electrically conductive layer 3. The separation zone 7 provides the subsequent electrical insulation between the cathode and the anode of the electronic component.

Figure 1E:
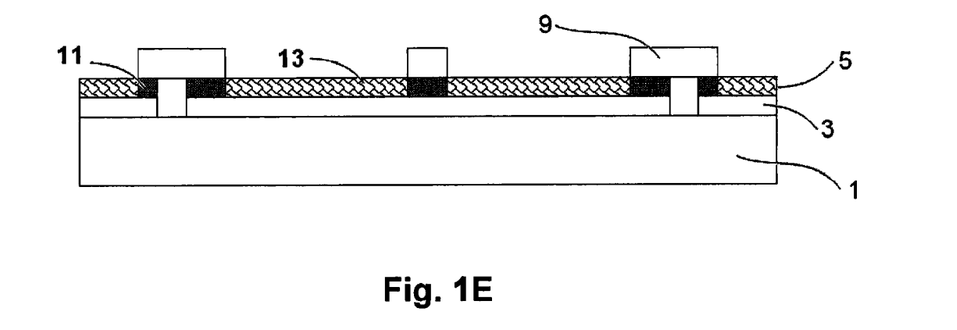

In the next step, as shown in FIG. 1E, an insulator 9 is applied in structured manner to the second electrically conductive layer 5, such that at least one first subzone 11 is produced, which is covered with the insulator 9, and at least one second subzone 13, which is not covered with the insulator.

The insulator 9 may be a lacquer. It may be applied to the second electrically conductive layer 5 by a printing process, such as for example screen printing, ink-jet printing or flexographic printing. The insulator 9 should be selected such that it is softenable by subsequent treatment and may be brought into a flowable state.

The function of the insulator 9 is primarily electrical insulation in the subsequent electronic component and the etch stop function of the second electrically conductive layer 5.

Next, a protective material 15 is applied to the second electrically conductive layer 5 (see FIG. 1F), which may or may not partially cover the insulator 9. The second electrically conductive layer 5 then comprises a third subzone 17, which is covered with protective material 15, and a fourth subzone 19, which is not covered with protective material.

Figure 1F:
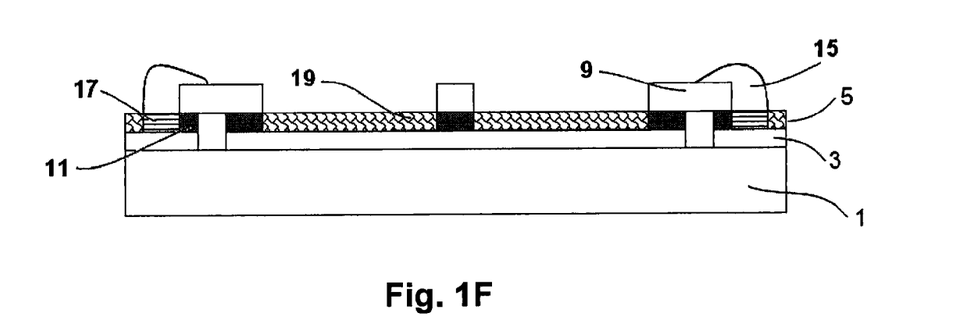

The protective material 15 may be a lacquer. The protective material 15 is preferably soluble in a solvent, in which the insulator 9 is insoluble or is at least only sparingly soluble.

The protective material 15 may be applied to the second electrically conductive layer 5 by a printing process, such as for example screen printing, ink-jet printing or flexographic printing. The function of the protective material 15 is in particular an etch stop function for the second electrically conductive layer 5.

Figure 1G:
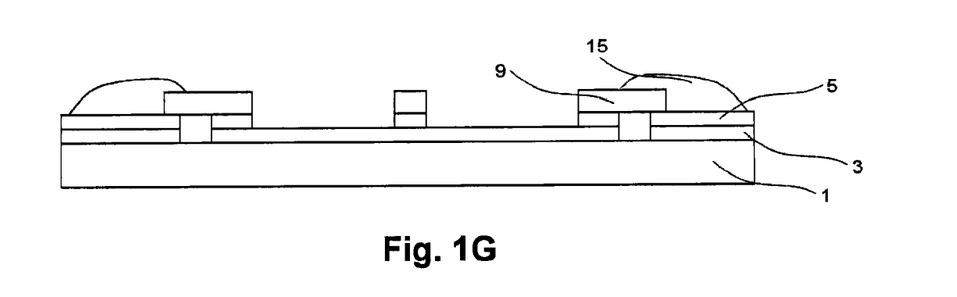
Figure 1H:
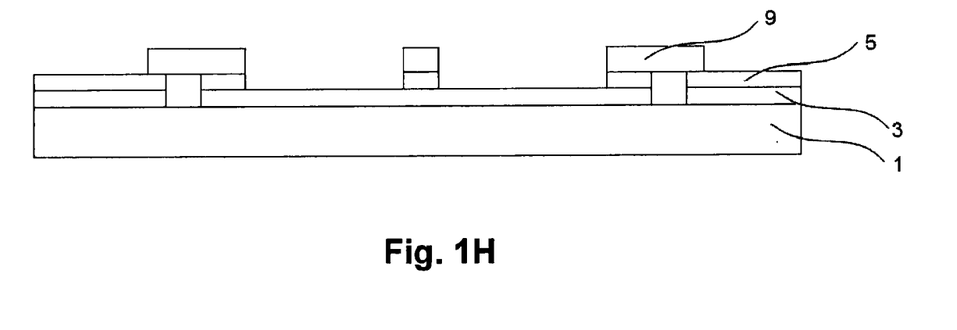

As shown in FIG. 1G, next comes removal of the second electrically conductive material of the second electrically conductive layer 5, etching preferably being used. For etching of the second electrically conductive layer 5 an etching bath, such as for example 3% trichloroacetic acid in water is used. In this case the metal structures of the second electrically conductive layer 5 of the fourth subzone 19 are removed, while those of the first subzone 11 and of the third subzone 17 are substantially retained.

In step I) the protective material 15 (in FIG. 1H the protective material is therefore no longer shown) is removed using a solvent.

Figure 1I:
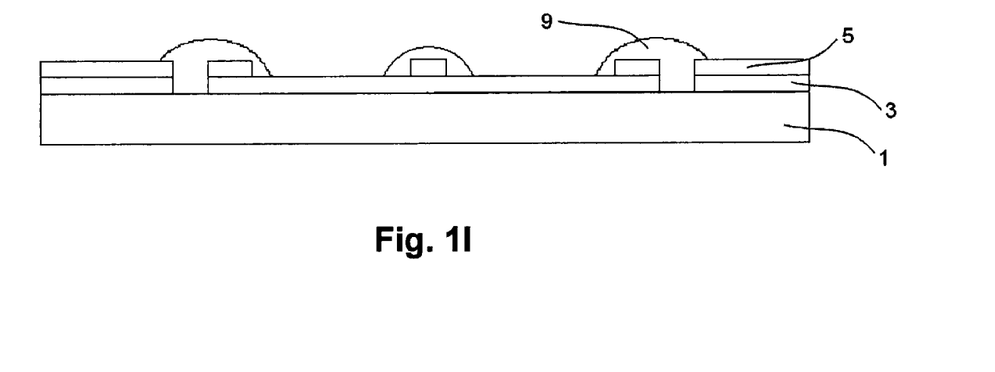

The substrate layer 1 or the insulator 9 is then heated directly such that the insulator 9 softens (reflow) and flows over the exposed edges of the second electrically conductive layer 5 and the first electrically conductive layer 3. As shown in FIG. 1I, the structure of the insulator 9 is rounded.

On the substrate layer prepared in this way it is now possible to produce the electronic component, for example an OLED, by a conventional method. To this end, in subsequent processing steps the semiconducting, light-generating organic layers and the second electrode layer, for example a cathode layer, are applied to the substrate layer under a vacuum by vapour deposition.

FIGS. 2A to I show preparation of a substrate for the production of an electronic component using the method of the invention according to a second embodiment.

The second embodiment corresponds substantially to the first embodiment, except that laser ablation of the first electrically conductive layer 3 and the second electrically conductive layer 5 proceeds after application of the insulator 9 and of the protective material 15:

after extensive application of the second electrically conductive layer 5 to the first electrically conductive layer 3, the insulator 9 is applied to the second electrically conductive layer 5 by a printing process (see FIG. 2D), such that a first subzone 11 with insulator 9 is present.

The protective material 15 is then applied to the second electrically conductive layer 5 (see FIG. 2E), such that a third subzone 17 is covered with protective material 15.

Figure 2A:
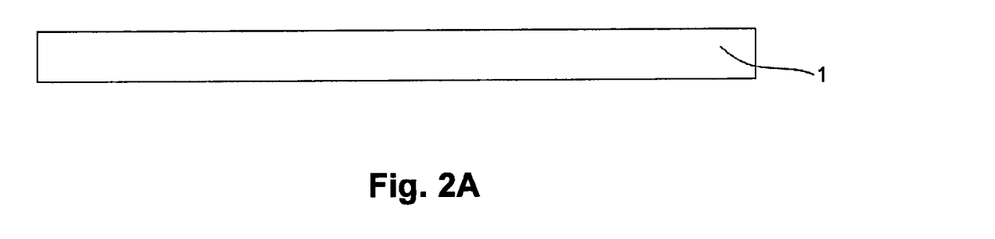
Figure 2B:
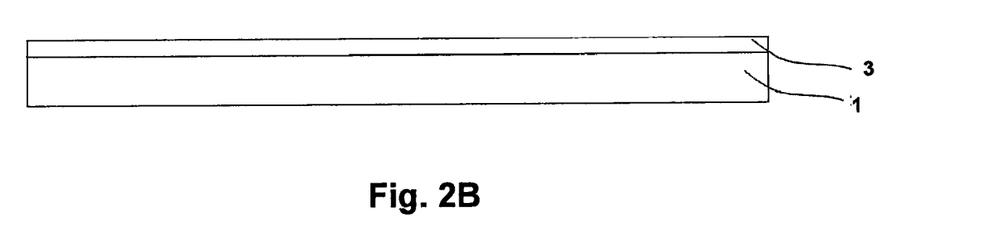
Figure 2C:
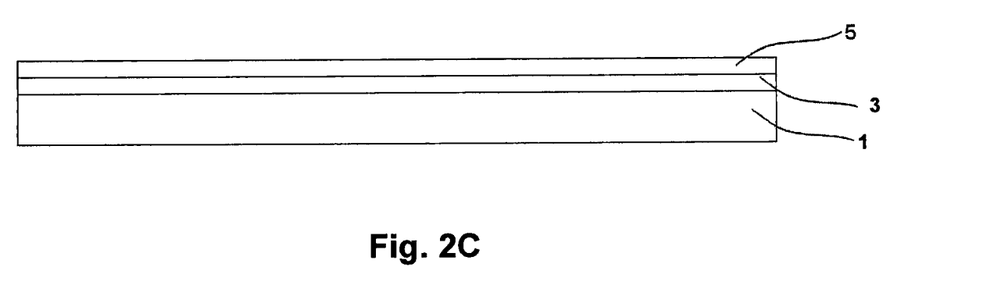
Figure 2D:
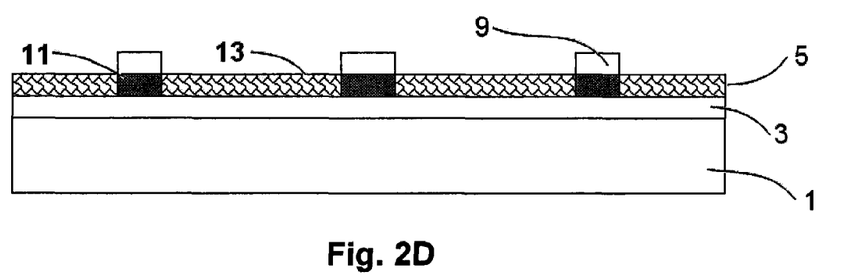
Figure 2E:
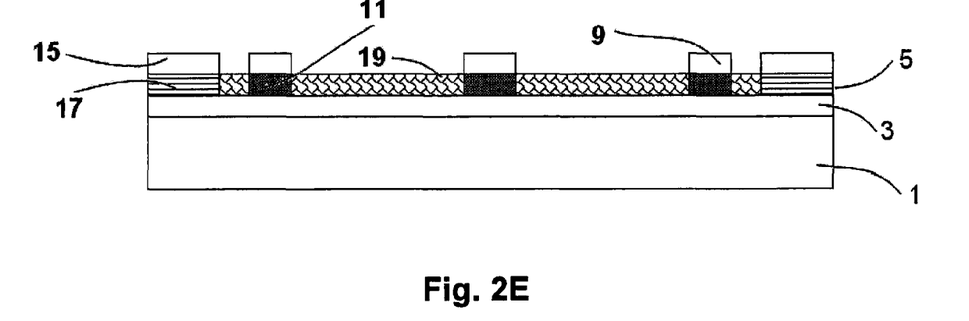
Figure 2F:
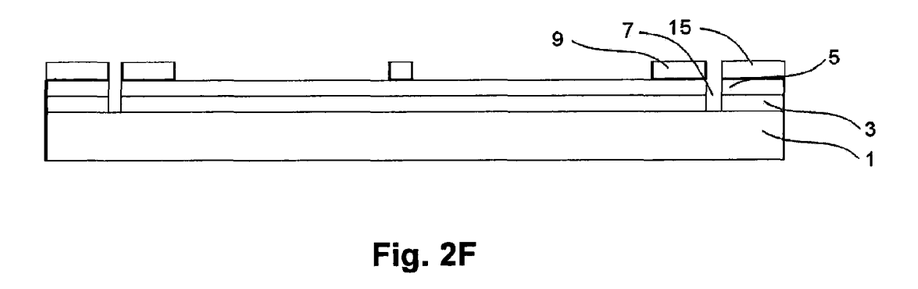
Figure 2G:
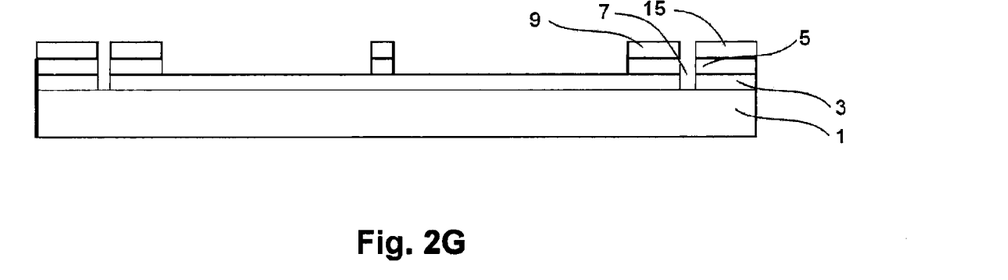
Figure 2H:
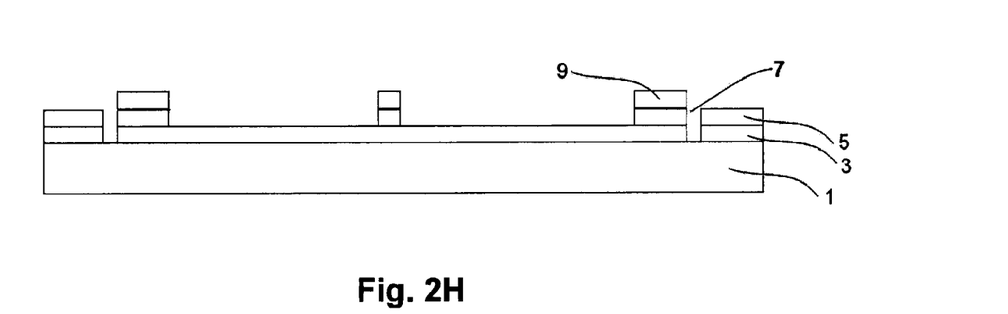
Figure 2I:
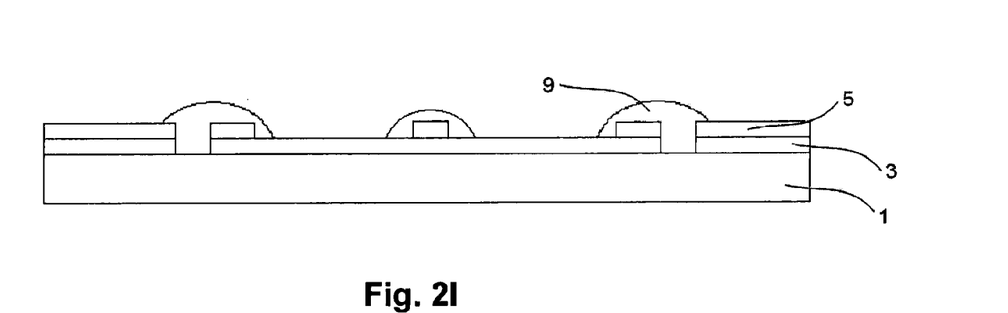

Then, as illustrated in FIG. 2F, laser ablation is performed, by means of which the separation zone 7 is produced in the second electrically conductive layer 5 and in the first electrically conductive layer 3. Such a separation zone 7 may for example provide subsequent electrical insulation between cathode and anode of the electronic component.

In this case the laser cut should extend in a gap between the insulator 9 and the protective material 15. Furthermore, the laser cut should extend so close to the edge of the insulator 9 that, in the process step of softening the insulator 9, the insulator 9 flows over the edge produced by the laser of the second electrically conductive layer 5 and the first electrically conductive layer 3.

The method then continues with the removal in turn of the second electrically conductive material in the fourth subzone 19 of the second electrically conductive layer 5 (see FIG. 2G), which removes protective material (see FIG. 2H), the insulator 9 is brought into a flowable state and introduced into the separation zone 7 (see FIG. 2I) and the remaining layers of the electronic component are deposited on the substrate layer prepared in this way (not shown).

It is alternatively also possible to structure the first electrically conductive layer by means of laser ablation and then to apply second electrically conductive material to zones of the first electrically conductive layer or extensively to the first electrically conductive layer, such that second electrically conductive material is introduced into the gaps produced by structuring of the first electrically conductive layer. The structuring of the first electrically conductive layer may then be re-exposed subsequently, by arranging the insulator and the layer material in such a way that in the etching process second electrically conductive material is removed in the zone in which trenches or the like were introduced into the first electrically conductive layer.

If the second electrically conductive layer and the first electrically conductive layer are jointly structured, any deposits or contaminants arising during the ablation process may be removed. Such a procedure may resemble the cleaning of silicon wafers and advantageously constitute a very clean process. It may alternatively also be advisable for the laser to cut through the insulator, the second electrically conductive layer and the first electrically conductive layer, such that on softening (reflow) of the insulator the insulator may fill the separation zone from both sides.

Figure 3:
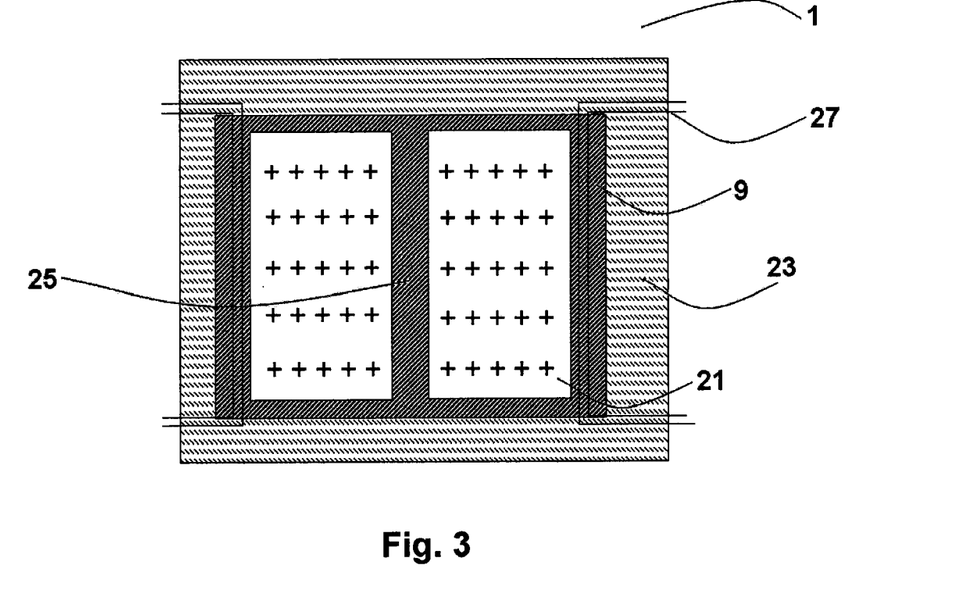
FIG. 3 shows a plan view onto a substrate template.

FIG. 3 shows a plan view of a prepared substrate layer 1 for producing an electronic component.

On its top the substrate layer 1 comprises a first electrode zone 21 and a second electrode zone 23, which are insulated from one another by the insulator 9.

A conductor track 25 is provided in the middle of the substrate template shown in FIG. 3. Feed lines 27 are arranged for electrical contacting of the component.

The invention claimed is:

1. A method for producing an electronic component with at least one first electrode zone and one second electrode zone, which are separated from one another by an insulator and each comprise at least one sublayer of a first electrically conductive material, comprising the steps of:
   A) providing a substrate layer and at least one first electrically conductive layer of the first electrically conductive material arranged on the substrate layer;
   B) arranging at least one second electrically conductive layer of a second electrically conductive material on the first electrically conductive layer;
   C) arranging at least one first insulator on the substrate, such that the second electrically conductive layer comprises at least one first subzone, which is covered with the insulator, and a second subzone, which is not covered with the insulator, the insulator being arranged such that it may serve to separate the first electrode zone and the second electrode zone from one another;
   D) arranging at least one functional layer and at least one second electrode layer on the second electrically conductive layer obtained in step C), which is covered in places with the insulator; and
   H) at least partial removal of the second electrically conductive layer in at least the fourth subzone of the second subzone,
   step H) being arranged to take place for at least one of (i) between step C) and step D), and (ii) between step G) and step D).

2. The method according to claim 1, further comprising the step:
   G) arranging at least one protective material in at least one third subzone, which is arranged at least partially in the second subzone, to take place for at least one of (i) between step B) and step C) and (ii) between step C) and step D), such that the second electrically conductive layer in at least one fourth subzone, which is arranged at least partially in the second subzone, is not covered with the protective material.

3. The method according to claim 1, wherein the second electrically conductive layer is removed by etching.

4. The method according to claim 1, further comprising the step:
   I) removing the protective material from the second electrically conductive layer, step I) taking place after step H).

* * * * *